(12) United States Patent
Colbert et al.

(10) Patent No.: US 7,777,329 B2
(45) Date of Patent: Aug. 17, 2010

(54) HEATSINK APPARATUS FOR APPLYING A SPECIFIED COMPRESSIVE FORCE TO AN INTEGRATED CIRCUIT DEVICE

(75) Inventors: John L. Colbert, Byron, MN (US); John S. Corbin, Jr., Austin, TX (US); Jason R. Eagle, Kasson, MN (US); Roger Duane Hamilton, Rochester, MN (US); Amanda E. Mikhail, Rochester, MN (US); Arvind K. Sinha, Rochester, MN (US); Terry L. Sobotta, Byron, MN (US)

(73) Assignee: International Business Machines Corporation, Armonk, NY (US)

( * ) Notice: Subject to any disclaimer, the term of this patent is extended or adjusted under 35 U.S.C. 154(b) by 712 days.

(21) Appl. No.: 11/460,334

(22) Filed: Jul. 27, 2006

(65) Prior Publication Data

US 2008/0024991 A1 Jan. 31, 2008

(51) Int. Cl.
*H05K 7/20* (2006.01)
(52) U.S. Cl. .............. 257/719; 257/E23.086; 257/712; 257/713; 257/717; 257/720; 361/704; 361/719
(58) Field of Classification Search .......... 257/E23.086, 257/719, 712, 713, 717, 720; 361/704, 719
See application file for complete search history.

(56) References Cited

U.S. PATENT DOCUMENTS 4,748,495 A  5/1988  Kucharek
5,305,185 A * 4/1994 Samarov et al. ............. 361/704
5,730,620 A  3/1998  Chan et al.
5,738,531 A * 4/1998 Beaman et al. ............... 439/71
5,770,891 A  6/1998  Frankeny et al.
5,870,286 A  2/1999  Butterbaugh et al.
5,901,039 A * 5/1999 Dehaine et al. ............. 361/704
5,932,925 A  8/1999  McIntyre
5,978,223 A  11/1999 Hamilton et al.
6,023,413 A * 2/2000 Umezawa ................... 361/697
6,198,630 B1  3/2001  Cromwell
6,261,404 B1  7/2001  Baska et al.
6,330,745 B1  12/2001 Cromwell et al.
6,385,044 B1  5/2002  Colbert et al.
6,386,890 B1  5/2002  Bhatt et al.

(Continued)

FOREIGN PATENT DOCUMENTS

EP  1059665 A  12/2000

(Continued)

*Primary Examiner*—Alexander O Williams
(74) *Attorney, Agent, or Firm*—Patterson & Sheridan, LLP

(57) ABSTRACT

An apparatus is provided having an integrated circuit device disposed on a printed circuit board and a heat dissipation device on the integrated circuit device. An actuation screw in a spring plate is urged against a portion of the heat dissipation device by tightening the actuation screw. The actuation screw may be prevented from being tightened beyond a mechanical constraint corresponding to a pre-set calibration for the specific compressive force, which may be greater than or equal to a minimum compressive force corresponding to the greater of a minimum thermal interface pressure and a minimum contact interface pressure. Additionally, a method is provided in which the actuation screw is tightened, but prevented from being tightened beyond the mechanical constraint.

9 Claims, 13 Drawing Sheets

U.S. PATENT DOCUMENTS

| | | | |
|---|---|---|---|
| 6,415,853 B1 | 7/2002 | Tao et al. | |
| 6,442,026 B2 | 8/2002 | Yamaoka | |
| 6,449,155 B1 | 9/2002 | Colbert et al. | |
| 6,449,162 B1 | 9/2002 | Corbin, Jr. et al. | |
| 6,475,011 B1 | 11/2002 | Sinha et al. | |
| 6,557,675 B2* | 5/2003 | Iannuzzelli | 188/380 |
| 6,639,800 B1* | 10/2003 | Eyman et al. | 361/704 |
| 6,724,629 B1 | 4/2004 | Augustin et al. | |
| 6,746,270 B2* | 6/2004 | Peterson et al. | 439/487 |
| 6,789,312 B2* | 9/2004 | White | 29/832 |
| 6,836,408 B2 | 12/2004 | Gektin et al. | |
| 6,898,083 B1* | 5/2005 | Hornung | 361/704 |
| 6,930,884 B2 | 8/2005 | Cromwell et al. | |
| 6,950,310 B2 | 9/2005 | Edwards | |
| 7,095,614 B2* | 8/2006 | Goldmann | 361/704 |
| 7,323,358 B1 | 1/2008 | Cromwell | |
| 7,327,573 B2 | 2/2008 | Lee et al. | |
| 7,486,516 B2 | 2/2009 | Colbert et al. | |
| 2002/0060064 A1 | 5/2002 | Yu | |
| 2003/0036301 A1* | 2/2003 | Colbert et al. | 439/331 |
| 2003/0166355 A1* | 9/2003 | Simons et al. | 439/331 |
| 2003/0192180 A1 | 10/2003 | Colbert et al. | |
| 2004/0038583 A1 | 2/2004 | Peterson et al. | |
| 2004/0244189 A1* | 12/2004 | White | 29/760 |
| 2004/0247925 A1 | 12/2004 | Cromwell | |
| 2004/0252462 A1 | 12/2004 | Cromwell et al. | |
| 2005/0006055 A1 | 1/2005 | Colbert et al. | |
| 2005/0122691 A1 | 6/2005 | Crippen et al. | |
| 2007/0035937 A1* | 2/2007 | Colbert et al. | 361/810 |
| 2007/0086168 A1 | 4/2007 | Khanna et al. | |
| 2007/0091576 A1* | 4/2007 | Wung et al. | 361/719 |
| 2007/0247813 A1* | 10/2007 | Colbert et al. | 361/707 |
| 2007/0268672 A1* | 11/2007 | Barsun et al. | 361/710 |
| 2008/0081489 A1 | 4/2008 | MacGregor et al. | |
| 2008/0259572 A1* | 10/2008 | Colbert et al. | 361/719 |
| 2008/0264603 A1* | 10/2008 | Colbert et al. | 165/80.2 |

FOREIGN PATENT DOCUMENTS

| | | |
|---|---|---|
| WO | 9810631 A | 3/1998 |
| WO | 9835540 A | 8/1998 |

\* cited by examiner

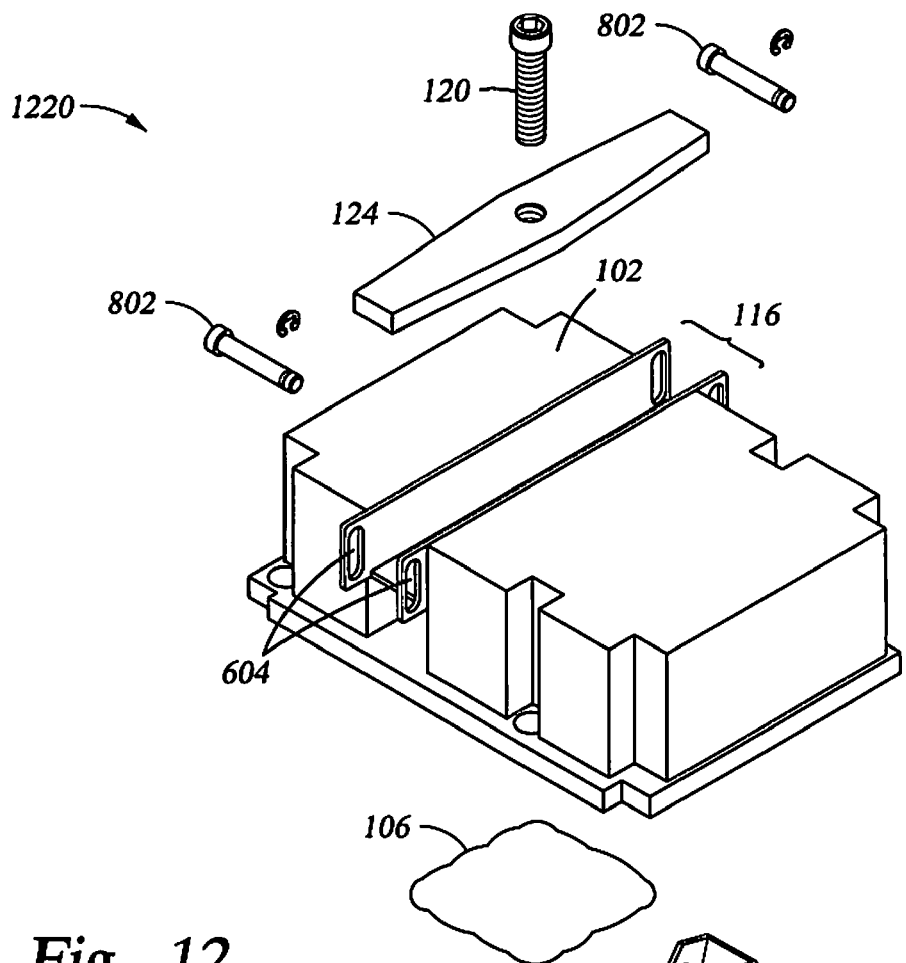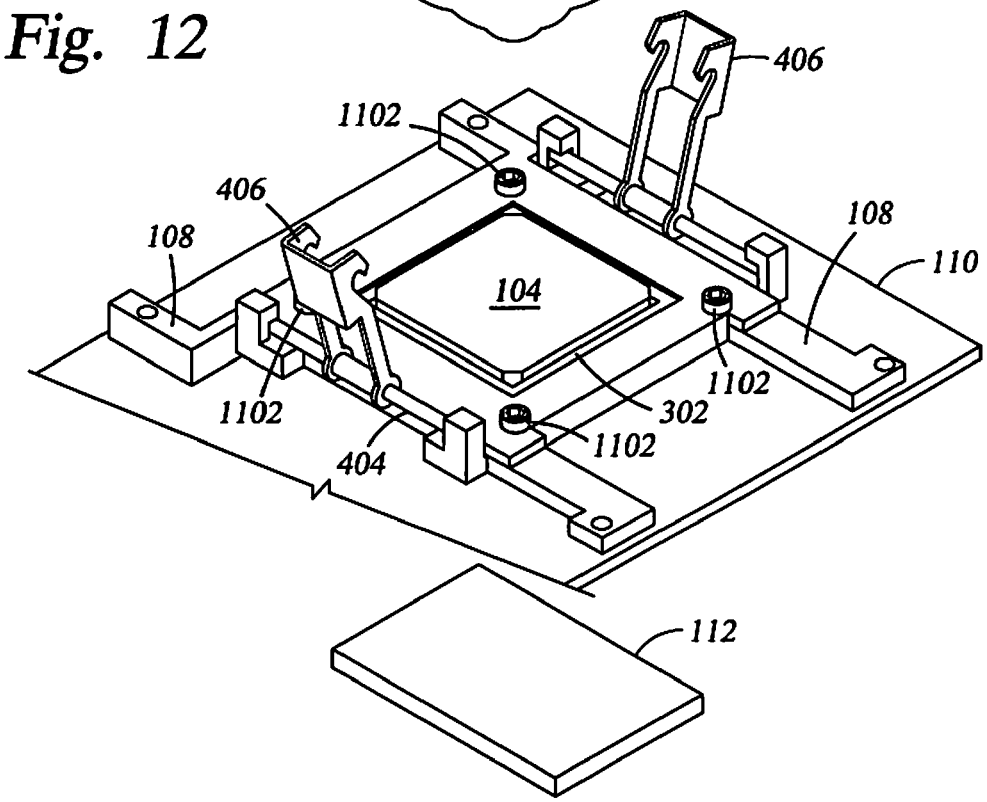
Fig. 12

HEATSINK APPARATUS FOR APPLYING A SPECIFIED COMPRESSIVE FORCE TO AN INTEGRATED CIRCUIT DEVICE

CROSS-REFERENCE TO RELATED APPLICATIONS

This application is related to U.S. patent application Ser. No. 11/201,972, entitled METHOD AND APPARATUS FOR MOUNTING A HEAT SINK IN THERMAL CONTACT WITH AN ELECTRONIC COMPONENT, filed Aug. 11, 2005, by John Lee Colbert et al. This related patent application is herein incorporated by reference in its entirety.

BACKGROUND OF THE INVENTION

1. Field of the Invention

The present invention generally relates to heat dissipation for a computing device, and more specifically, to a method and apparatus for applying a specified compressive force by a heat dissipation device for an integrated circuit.

2. Description of the Related Art

Modern computer processors are typically integrated circuits (IC) which are fabricated upon a die and placed in a package. As IC's become faster, smaller, and generally more powerful, they may also generate more heat. When the IC becomes too hot, damage to the IC circuitry may occur, resulting in a partially or completely non-functioning IC. Consequently, heatsinks are frequently utilized to dissipate heat from the IC and keep the IC functioning properly.

Another consequence of improving integrated circuits may be the use of more connections for transmitting power and data between the IC package and a circuit board on which the IC package is mounted. In order to add such connections without dramatically increasing the size of the IC package, higher contact densities may be needed. In one example, Land Grid Array (LGA) packaging may be used to provide such higher contact densities.

In LGA packaging, the IC package has flat contacts which, when the IC package is loaded into a socket, may sit on pins contained within the socket housing. The LGA package may offer increased contact density, decreased contact resistivity, and zero-insertion-force installation. However, similar to other packaging techniques, LGA packaging may require a specified compressive force to hold the IC package in place. If an IC package is not held in place by an adequate compressive force, the electrical stability at the contact interface of the package and circuit board may be compromised and IC performance may suffer. If the IC package is held in place with a compressive force greater than what is necessary, there may be a risk of mechanical damage to the IC and/or a possibility of electrical shorting. Therefore, there is typically a desire to hold the IC package in place using a nominal load that achieves the specified compressive force throughout the entire area of the IC package.

Accordingly, what is needed is an improved method and apparatus for applying a consistent compressive force to an IC package that also serves to dissipate heat from the IC.

SUMMARY OF THE INVENTION

The present invention generally relates to heat dissipation in a computing device, and more specifically, to a method and apparatus for applying a specified compressive force by a heat dissipation device for an integrated circuit. In one embodiment, a method for applying a specific compressive force from a heat dissipation device onto one or more integrated circuit devices includes placing the integrated circuit device onto a printed circuit board (PCB) and then placing the heat dissipation device onto the integrated circuit device. The method further includes tightening an actuation screw in a spring plate against a portion of the heat dissipation device. The actuation screw may be prevented from being tightened beyond a mechanical constraint corresponding to a pre-set calibration for the specific compressive force.

In one embodiment, a device for applying a specific compressive force from a heat dissipation device onto one or more integrated circuit devices is given. The device may include an integrated circuit placed on a PCB, the heat dissipation device placed on the integrated circuit and a spring plate placed on the heat dissipation device. The device may further include an actuation screw threaded through the spring plate. The actuation screw may be configured so that when it is tightened, the actuation screw may cause a compressive force to be applied from the heat dissipation device onto the one or more integrated circuit devices. The actuation screw may be prevented from being tightened beyond a mechanical constraint corresponding to a pre-set calibration for the specific compressive force.

In one embodiment, a method for manufacturing an assembly including a heat dissipation device, a spring plate, and a spring rod assembly may include determining a first minimum specific compressive force to be applied to an integrated circuit device by the assembly when an actuation screw is tightened through the spring plate. The method may also include determining a corresponding second minimum specific compressive force to be applied to the heat dissipation device, resulting in the first minimum specific compressive force being applied to the integrated circuit device. The method may further include calculating a first deflection distance for at least one of the spring plate and the spring rod assembly such that the at least one of the spring plate and the spring rod assembly are collectively deflected by the first deflection distance when at least the second minimum specific compressive force is applied to the heat dissipation device. The method may further include providing the actuation screw with a thread pattern and a mechanical constraint which, when tightened, may produce a second deflection distance for the spring plate. The actuation screw may be mechanically prevented from being tightened to a position where the second deflection distance is greater than the first deflection distance.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 12 is a block diagram illustrating an exploded view of the PCB and heatsink assembly, according to one embodiment of the invention.

DETAILED DESCRIPTION OF THE PREFERRED EMBODIMENTS

The present invention generally relates to heat dissipation in a computing device, and more specifically, to a method and apparatus for applying a specified compressive force by a heat dissipation device for an integrated circuit. In one embodiment, a method for applying a specific compressive force from a heat dissipation device onto one or more integrated circuit devices includes placing the integrated circuit device onto a printed circuit board (PCB) and then placing the heat dissipation device onto the integrated circuit device. The method further includes tightening an actuation screw threaded through a spring plate against a portion of the heat dissipation device. The actuation screw may be prevented from being tightened beyond a mechanical constraint corresponding to a pre-set calibration for the specific compressive force.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

General Operation of a Heat Dissipation Device

Figure 1:
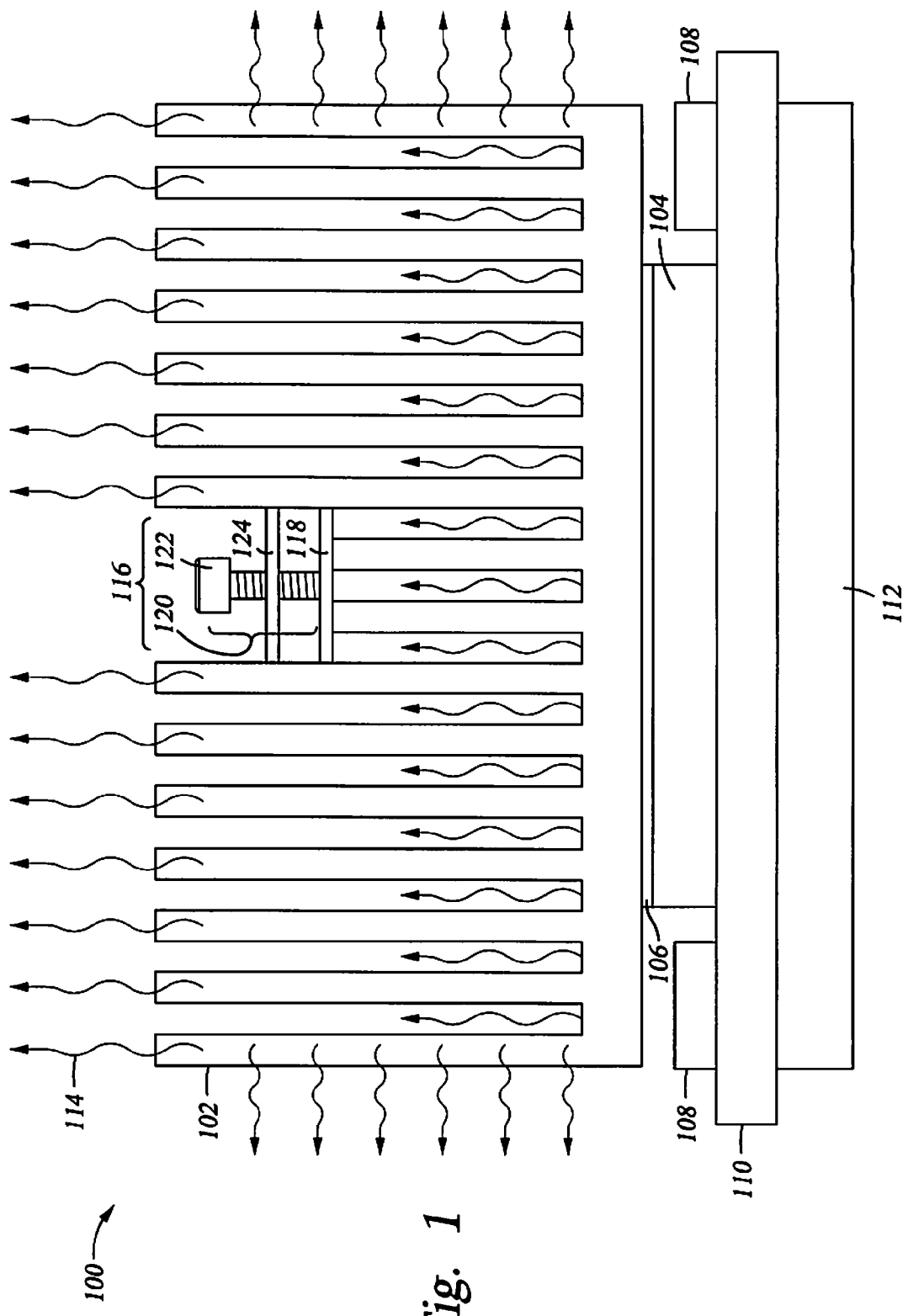
FIG. 1 is a block diagram illustrating a heatsink, according to one embodiment of the invention.

FIG. 1 is a block diagram illustrating a heatsink 102 and its application 100, according to one embodiment of the invention. In the depicted embodiment, an integrated circuit (IC) package 104 installed on a printed circuit board (PCB) 110 may generate heat 114. The heat 114 from the IC package may diffuse through a thermally conductive material 106 into the heatsink 102. The heatsink 102 may have multiple structures to facilitate the dissipation of the heat 114, including fins, heat pipes, and/or vapor chambers.

In one embodiment, the heatsink 102 may be secured to a front-side stiffener 108. The heatsink 102 may apply pressure to the IC package 104, which may cause the PCB 110 to flex. In order to reduce this flex, the PCB 110 may be held between the front-side stiffener 108 and a back-side stiffener 112. Alternatively, the no front-side and/or back-side stiffener 108, 112 may be present and the heatsink 102 may be secured directly to the PCB 110.

In one embodiment, the heatsink 102 may contain a channel 116 called a U-channel 116 embedded in the top of the heatsink 102. The U-channel 116 may contain a horizontal member called a U-channel support beam 118, onto which a spring plate 124 may be set. An actuation screw 120 may be threaded through the spring plate, and may rest on the U-channel support beam 118, as described below.

Figure 2:
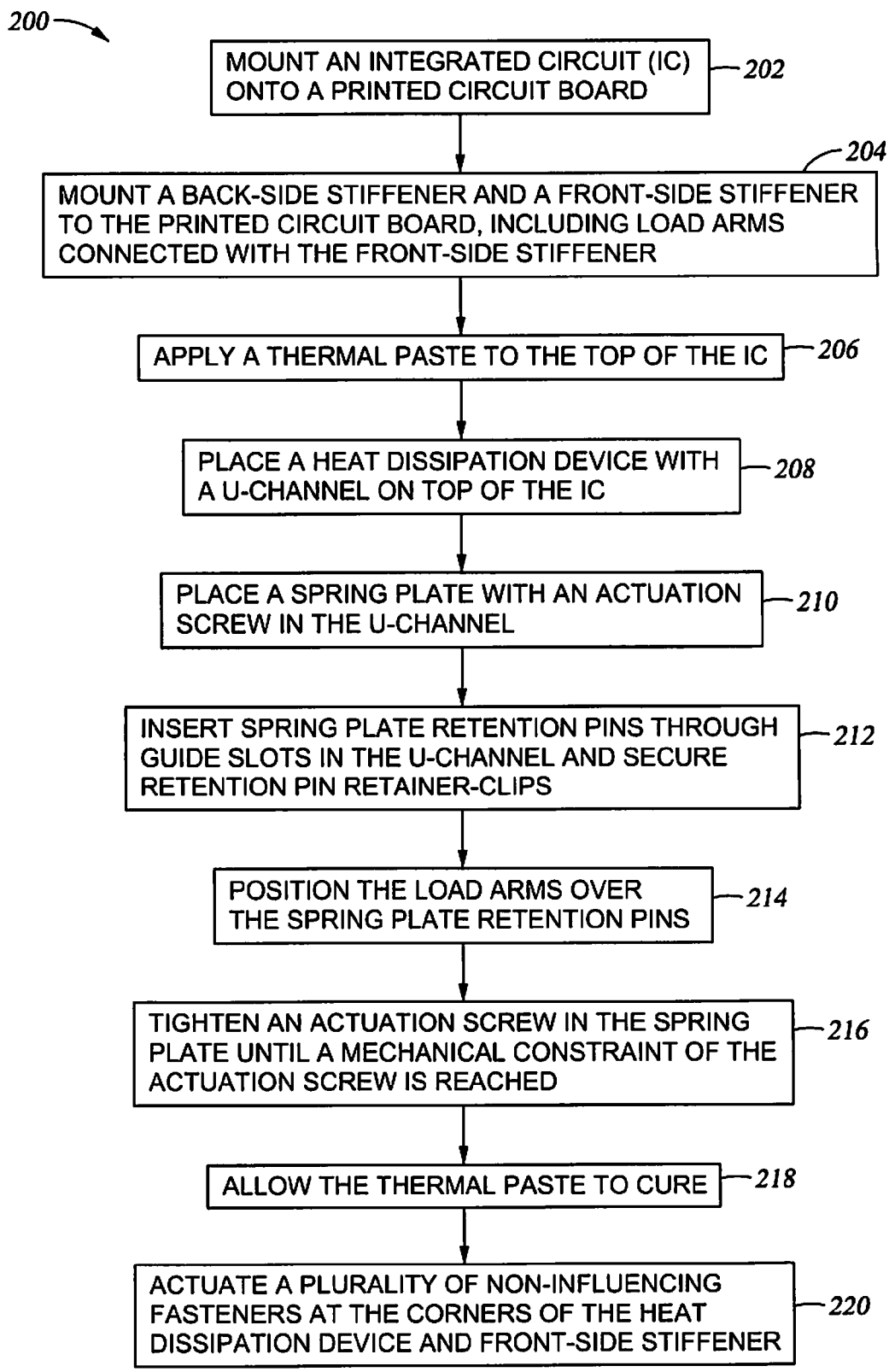
FIG. 2 is a flow chart depicting a process for installing a heatsink apparatus for applying a specified compressive force to the package of an integrated circuit (IC) device, according to one embodiment of the invention.

Process for Installing a Heatsink Apparatus for Applying a Specified Compressive Force to an Integrated Circuit FIG. 2 is a flow chart depicting a process 200 for installing a heatsink 102 for applying a specified compressive force to the package of an IC device 104, according to one embodiment of the invention. The process may begin at step 202, where an IC package 104 is mounted onto a PCB 110. For example, the IC package 104 may be mounted directly to the PCB 110, may be mounted into a pin grid array (PGA) socket, or may be mounted into a land grid array (LGA) socket.

In one embodiment, a back-side stiffener 112 and a front-side stiffener 108 may be mounted to the PCB 110 at step 204. For example, the front-side stiffener 108 may surround the sides of the IC package 104 (and the IC socket if applicable), and the back-side stiffener 112 may cover the PCB 110 on the side opposite the IC package 104. Alternatively, the IC socket may be built into the front-side stiffener 108. Optionally, there may be an insulator between the back-side stiffener 112 and the PCB 110.

In one embodiment, the front-side stiffener 108 may include one or more load arms attached to one or more spring rods. The spring rods may be pliable metal or non-metal rods fixed at their ends to the front-side stiffener 108. The gauge of the spring rods and their material may vary, depending on the specified compressive force which may need to be applied to the IC device 104 by the heatsink 102. For example, embodiments of the present invention may be used to apply a compressive force of between 70 and 700 lbs to an IC package 104, which may correspond to a spring rod gauge of between 3 and 5 mm. The specified force range of between 70 and 700 lbs is exemplary and, in some cases, other desired ranges may be utilized with embodiments of this invention.

In one embodiment, the load arm may be an arm which is attached to the spring rod and may be able to pivot around the spring rod. The load arm may be made out of a material with little to no creep and may be metallic. Creep may refer to a material's slow permanent deformation when under high temperature and/or pressure. One or more hooks may be located at the end of the load arm opposite the spring rod. The load arm may be made up of two branches joined at the hooked end of the load arm so that air may flow between the individual branches of the load arm.

In one embodiment, once the IC package 104 is mounted to the PCB 108, a thermally conductive material 106 may be placed on top of the IC package 104 at step 206. This thermally conductive material 106 may eventually form a seal between the IC package 104 and a heatsink 102, and may further serve to facilitate the dissipation of heat 114 from the IC package 104. Alternatively, in some cases, thermally conductive material 106 may not be used.

In one embodiment, the heatsink 102 may be placed on top of the IC package 104 and front-side stiffener 108 at step 208. The heatsink 102 may have a U-channel 116 in it that may line up with the load arms attached to the front-side stiffener 108. Spring plate retention pin guide slots may be located at the ends of the U-channel 116.

In one embodiment, a spring plate 124 with an actuation screw 120 may be placed in the U-channel 116 at step 210. The spring plate 124 may be a pliable metal or non-metal plate. The thickness and material of the plate may vary, depending on the specified force applied to the integrated circuit 104 by the heatsink 102, as discussed above with respect to the spring rods. To cover the range of forces discussed above, between 70 and 700 lbs, the spring plate 124 may range from a single 1.5 mm thick plate to several 3 mm plates contributing to create a laminated spring plate.

In one embodiment, the actuation screw 120 may be a screw threaded through the spring plate 124. The actuation screw 120 may have a mechanical constraint so that when the actuation screw 120 reaches a designated depth through the spring plate 124, the actuation screw 120 may not be threaded any deeper. Such a mechanical constraint may include anything that prevents the actuation screw 120 from being threaded any further into the spring plate 124, including a screw head 122, a washer, a spacer, a nut, a non-threaded portion of the actuation screw 120, a pin through the actuation screw 120, and a discontinuity in the thread pattern of the actuation screw 120 (e.g., a smooth, unthreaded portion of a shaft of the screw). When the actuation screw is tightened to a limit corresponding to the mechanical constraint, the deflection in the spring plate 124 may cause the heatsink 102 to exhibit the specified compressive force onto the integrated circuit device 104.

In one embodiment, the actuation screw 120 may be a typical screw where the diameter of a threaded portion is such that the screw may be threaded into a similarly sized hold in the spring plate 124. The diameter of a head 122 of the screw, however, may be too large to fit through the hole. In this case, the head 122 of the screw may be the mechanical constraint, and a length of the screw may correspond to the specified compressive force. In another embodiment, at least one spacer, such as a washer, may be used in addition to the typical screw. The spacer may have a hole with a diameter larger the threaded potion of the screw, but smaller than the head 122 of the screw. Therefore, the spacer, and not the head 122 of the screw, may be the mechanical constraint since it may contact the top of the spring plate. In this embodiment, one of a plurality of spacers, each corresponding to a different specified compressive force, may be used so that a single actuation screw 120 may be used to obtain one of a plurality of corresponding specified compressive forces.

In one embodiment, spring plate retention pins may be inserted through the spring plate retention pin guide slots at the ends of the U-channel 116 at step 212. The spring plate retention pins may be any type of pin capable of being secured in the spring plate retention pin guide slots and able to withstand the stresses placed upon them by the spring plate 124, as is described below. For example, each spring plate retention pin may be a nut and a bolt combination, a screw and retainer-clip combination, a rivet, or a metal bar.

In one embodiment, the load arms may be pivoted about the spring rods so that the load arms are positioned over the spring plate retention pins at step 214. The arrangement of the spring plate retention pin guide slots may be such that the spring plate retention pins may be vertically limited by the load arms before the pin would be able to reach the top of the spring plate retention pin guide slot.

In one embodiment, at step 216, the actuation 120 screw may be threaded until the mechanical constraint, such as the head 122 of the actuation screw, is reached and the actuation screw 120 is prevented from being threaded any deeper into the spring plate 124. As the actuation screw 120 is threaded into the spring plate 124, the bottom of the actuation screw 120 may contact a U-channel support beam 118, which may be a flat plate into which the actuation screw 120 cannot be threaded. In response, the spring plate 124 may rise as the actuation screw 120 is threaded. As the spring plate 124 rises, its sides may contact the spring plate retention pins, causing them to rise (confined in the spring plate retention pin guide slots) with the spring plate 124. When the spring plate retention pins contact the hooked portions of the load arms, the spring plate retention pins, and thus the sides of the spring plate 124, may be vertically constrained.

As the actuation screw 120 is further threaded, causing the bottom of the actuation screw 120 to press with more force against the top of the U-channel support beam 118, the spring plate 124 may begin to deflect, rising in its middle but remaining stationary at its vertically constrained sides. This spring plate deflection may cause a force to be exhibited downward from the actuation screw 120 onto the heatsink 102, which may exhibit a compressive force on the IC package 104. The compressive force may increase as the actuation screw 120 is threaded deeper into the spring plate 124. An upward force equal to the downward force from the bottom of the actuation screw may be distributed to the load arms through the interface of the spring plate 124 and the spring plate retention pins. Once the mechanical constraint of the actuation screw 120 is reached, the compressive force on the IC package 104 from the heatsink 102 may be at a pre-calibrated specified compressive force, as described above.

In the above configuration, the actuation screw 120 may be in compression, exerting force downward on U-channel support beam 116 of the heatsink 102 as a result of the upward force exerted on the spring plate 124 by the actuation screw 120, according to one embodiment. The spring plate 124 may deflect as a result of the upward force and distribute the upward force into the load arms through the spring plate retention pins. The load arms, in tension, may deflect the middle of spring rods upwards so that the spring rods and the spring plate 124 contribute in series to a total deflection distance, which is proportional to the downward force onto the IC package 104. Thus, after determining a desired specified compressive force on the IC package 104, the spring rod spring constant, and the spring plate 124 spring constant, a desired deflection distance for the spring plate 124 and the spring rods may be calculated. The desired deflection distance may then be used to select an appropriate mechanical constraint for the actuation screw 120 as described above, thereby ensuring that when the actuation screw 120 is fully tightened, the correct specified compressive force is applied to the heatsink 102.

In one embodiment, at step 218, once the heatsink 102 is attached to the IC package 104, the thermally conductive material 106 may be cured. Any acceptable thermally conductive material 106 may be used. Furthermore, any acceptable method of curing may be used, including using infrared light, heat, or self-curing paste. Alternatively, the thermally conductive material 106 may not be cured.

In one embodiment, one or more non-influencing fasters may be engaged to further secure the heatsink 102 to the IC package 104 at step 220. Non-influencing fasteners are fasteners on the front-side stiffener 108 that when engaged, may expand outwards and grip the heatsink 102. Alternatively, other fasteners may be used, or no fasteners may be used.

In one embodiment, utilizing the process 200 may result in a compressive force on the IC package 104. The compressive force may be greater than or equal to a minimum compressive force, while remaining less than or equal to a specified maximum compressive force. The specified maximum compressive force may correspond to the greatest force able to be applied to the IC package 104 before it is damaged, which may be specified by the manufacturer of the IC package 104. The minimum compressive force may correspond to a minimum thermal interface pressure for obtaining a necessary amount of heat flow 114 into the heatsink 102. Alternatively, the minimum compressive force may correspond to a minimum contact pressure allowable at an interface between the IC package 104 and the PCB 110 or a socket.

In one embodiment, the compressive force may be within ±5% of the required compliance load for the IC package 104. Optionally, another desired tolerance may be utilized. The tolerance may be maintained across the entire IC package 104. This may be beneficial because, as described above, if the compressive force on the IC package 104 is well below the required compliance load, the electrical stability at the contact interface of the IC package 104 and PCB 108 may be compromised and IC performance may suffer. If the IC package 104 is held in place with a compressive force greater than what is necessary, there may be a risk of mechanical damage to the IC and/or a possibility of electrical shorting.

Example of the Process for Installing a Heatsink Apparatus for Applying a Specified Compressive Force to an Integrated Circuit The process 200 describes a process for installing a heatsink apparatus for applying a specified compressive force to an integrated circuit device, according to one embodiment of the invention. Illustratively, FIGS. 3-13 depict an example of heatsink installation in accordance with process 200, and as such, the process 200 of FIG. 2 will be referenced in conjunction with FIGS. 3-13.

Figure 3:
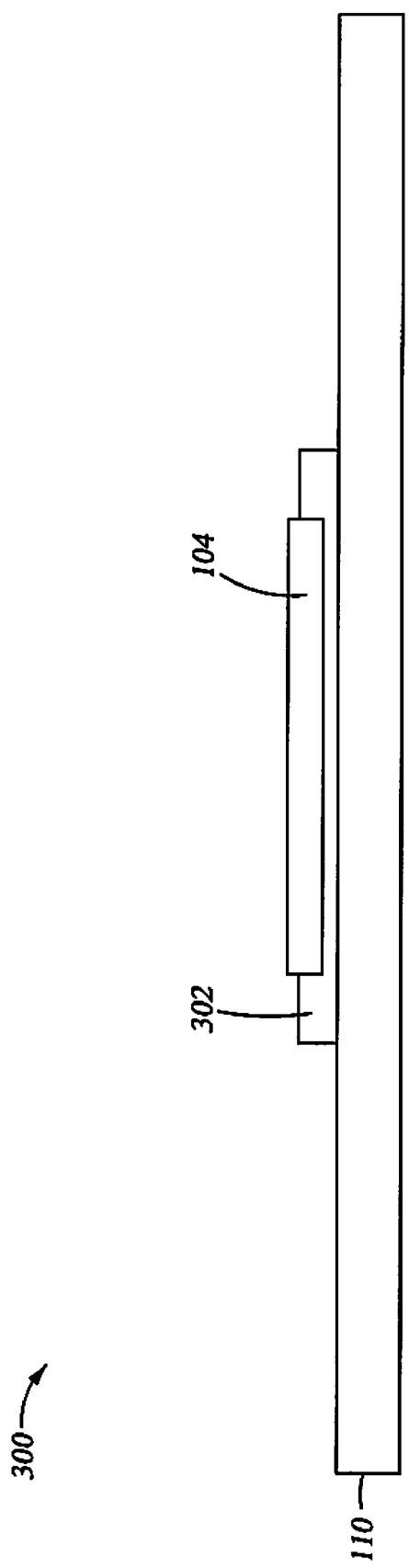
FIG. 3 is a block diagram illustrating an IC package contained within an IC socket mounted onto a printed circuit board (PCB), according to one embodiment of the invention.

In one embodiment, as described in step 202 of the process 200, an IC package 104 is contained within an IC socket 302 mounted onto a PCB 110, as depicted in FIG. 3 and FIG. 12. The IC package type may be any type of IC which requires an IC socket 302. For example, the IC package may be either a LGA or a PGA type package. Alternatively, the IC may be directly mounted to the PCB and may not require an IC socket 302.

Figure 4:
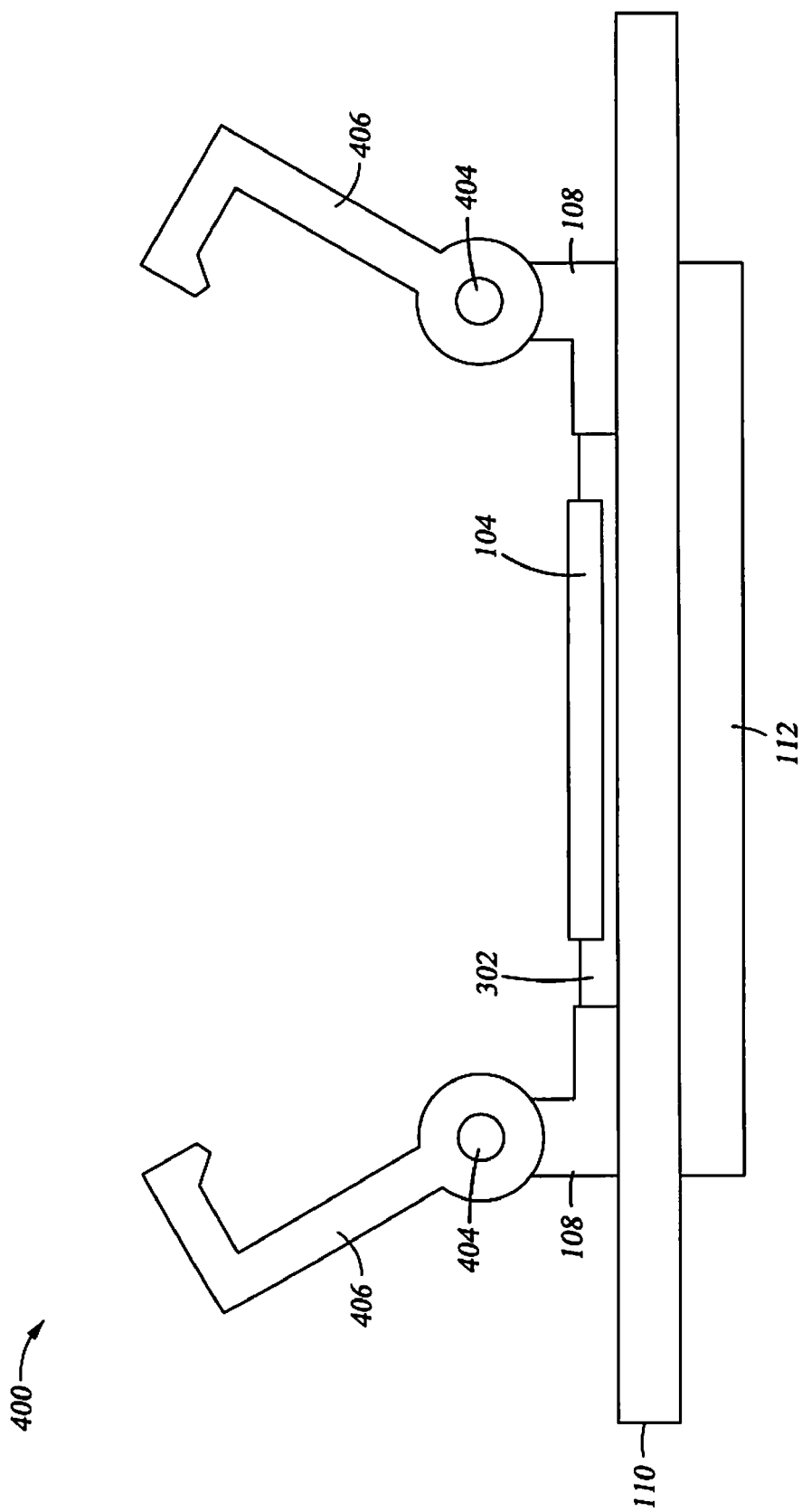
FIG. 4 is a block diagram illustrating the PCB containing the IC package and IC socket after the addition of a back-side stiffener and a front-side stiffener, including load arms mounted to the front-side stiffener by spring rods, according to one embodiment of the invention.
Figure 13:
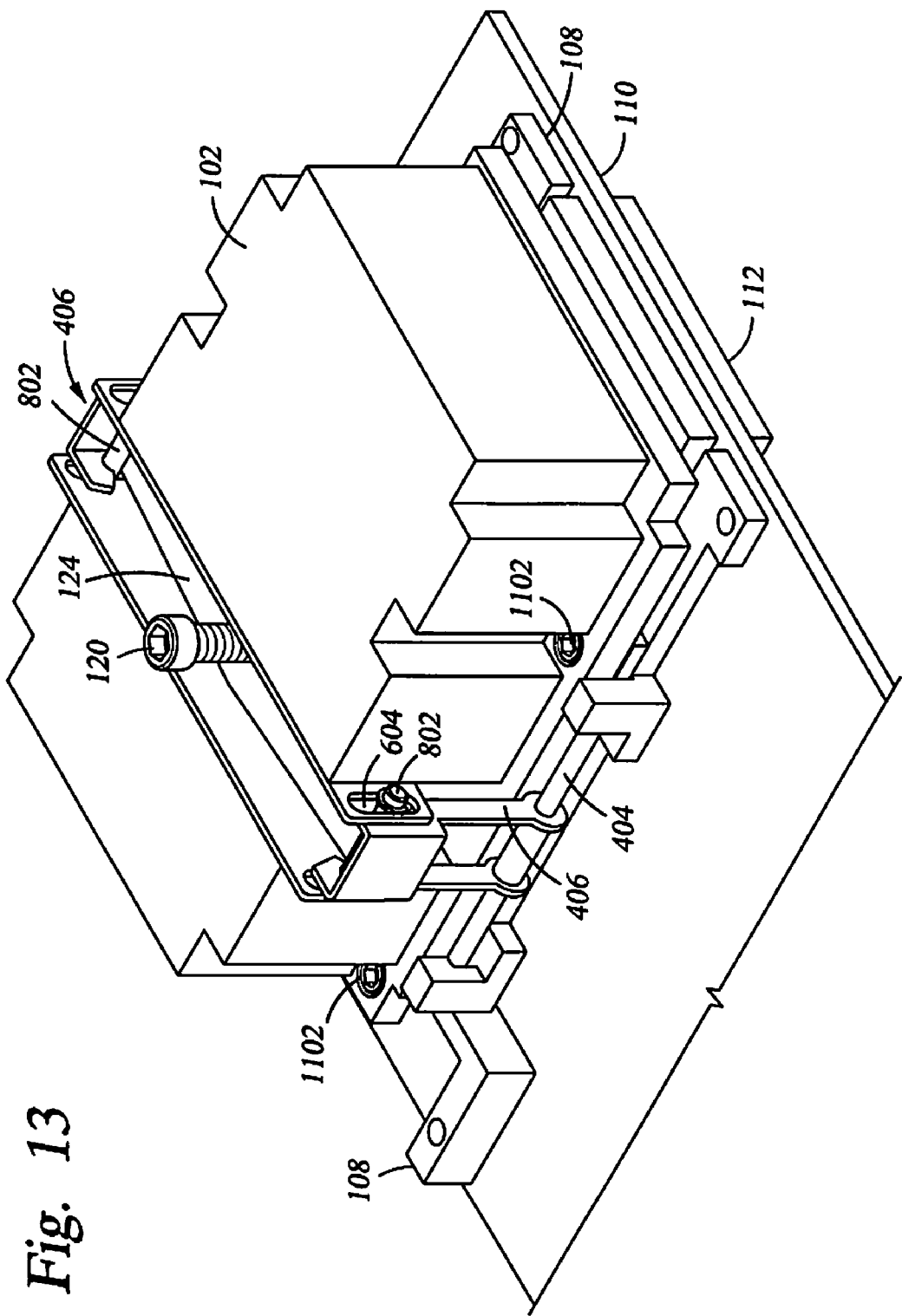
FIG. 13 is a block diagram illustrating an isometric view of the PCB and heatsink assembly, according to one embodiment of the invention.

In one embodiment, as described in step 204 of the process 200, a front-side stiffener 108 and a back-side stiffener 112 may be added to the existing PCB 110 and IC package 104 combination, as is illustrated in FIGS. 4, 12, and 13. The front-side stiffener 108 may include load arms 406 attached to the front-side stiffener 108 by a spring rod 404. The load arms 406 may be able to pivot around the spring rod 404. Optionally, an insulator may be inserted between the back-side stiffener and the PCB 110.

Figure 5:
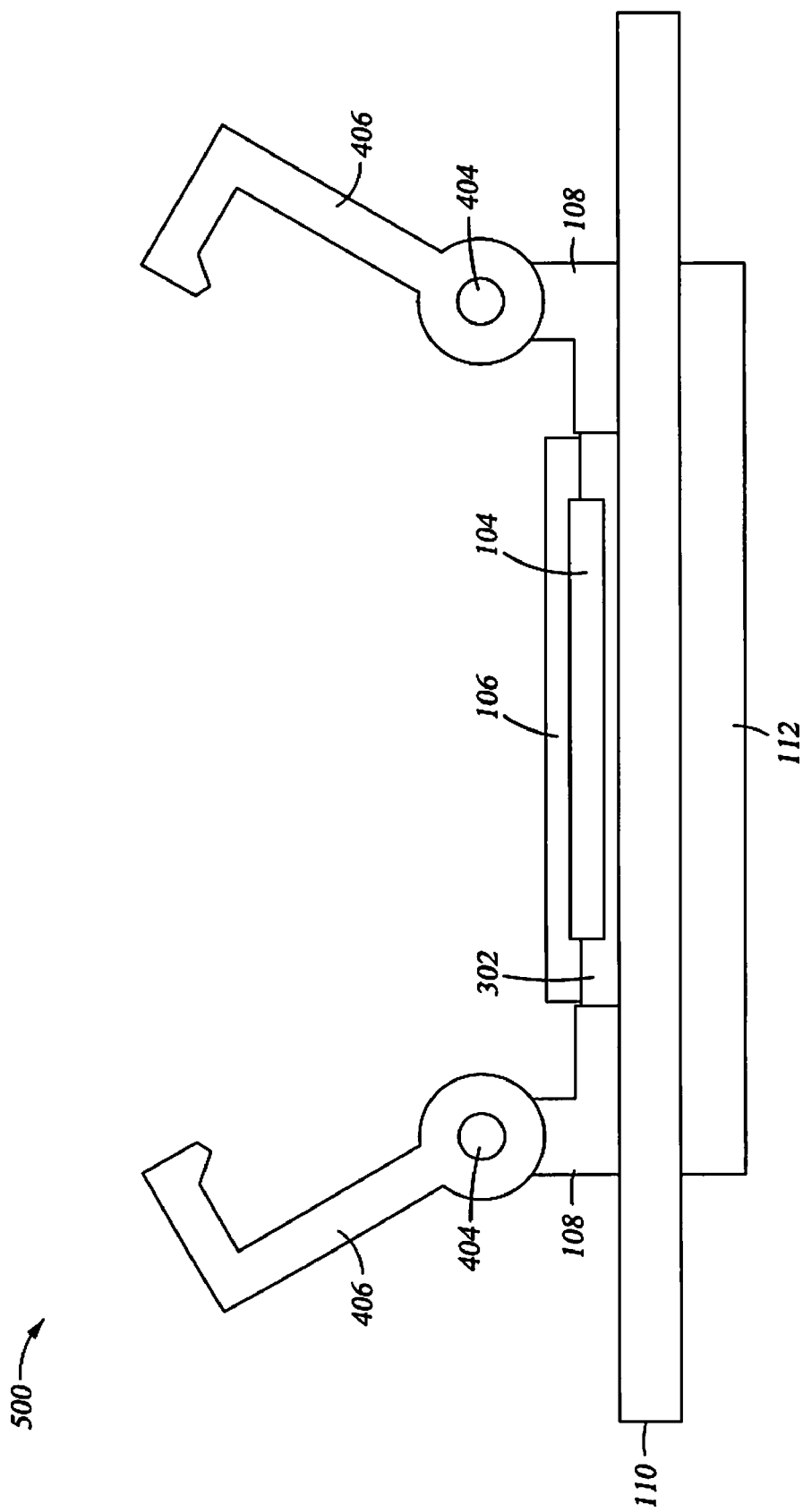
FIG. 5 is a block diagram illustrating the PCB after the addition of a thermally conductive material, according to one embodiment of the invention.
Figure 6:
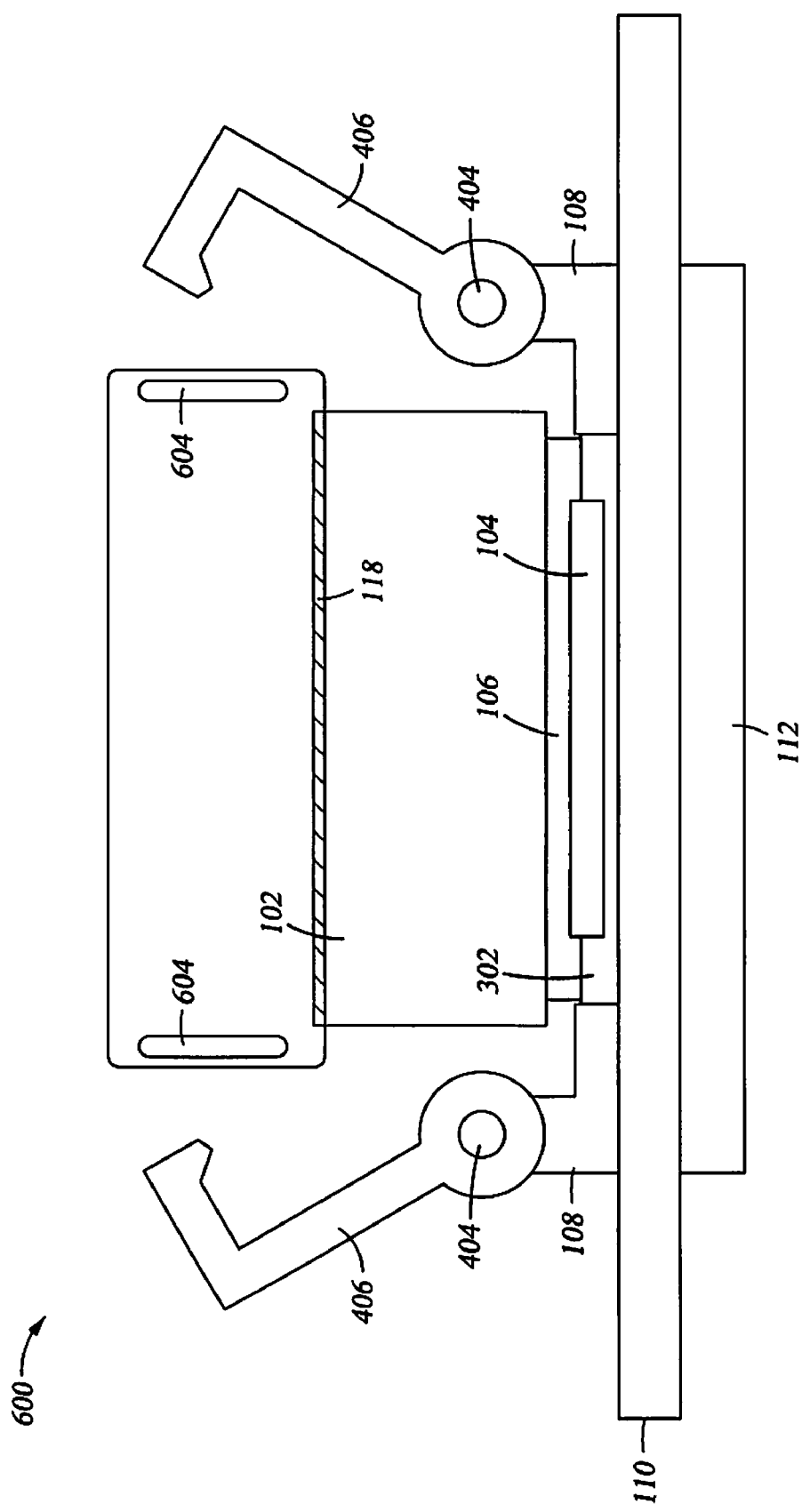
FIG. 6 is a block diagram illustrating the PCB after the addition of a heatsink, according to one embodiment of the invention.

In one embodiment, as described in step 206 of the process 200, a thermally conductive material 106 may be added to the top of the IC package 104, as depicted in FIG. 5 and FIG. 12. This thermally conductive material 106 may serve to aid in diffusion of heat 114 from the IC 104, as depicted in FIG. 1. Furthermore, as described in step 208 and depicted in FIGS. 6, 12, and 13, a heatsink 102 may be placed on top of the existing PCB 110, IC package 104, front-side stiffener 108, and thermally conductive material 106 combination. The heatsink 102 may contain a channel called a U-channel 116. At the ends of the U-channel 116 there may be spring plate retention pin guide slots 604.

Figure 7:
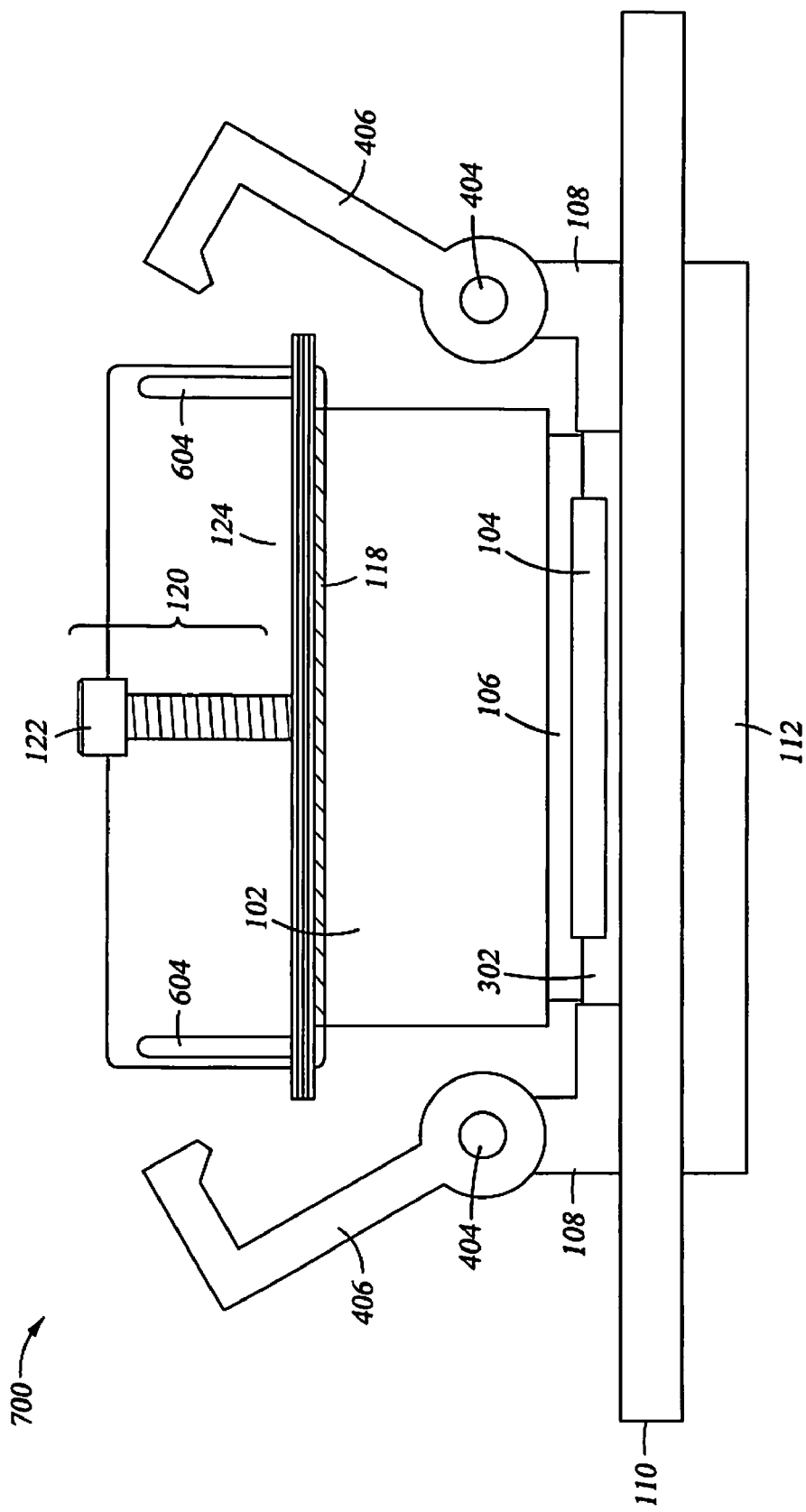
FIG. 7 is a block diagram illustrating the PCB after the addition of a spring plate and an actuation screw, according to one embodiment of the invention.

In one embodiment, as described in step 210 of the process 200, a spring plate 124 with an actuation screw 120 may be placed in the U-channel 116, as depicted in FIGS. 7, 12, and 13. The spring plate 124 may be made of several layers of a flexible material. The actuation screw 120 may be threaded into the spring plate 124.

Figure 8:
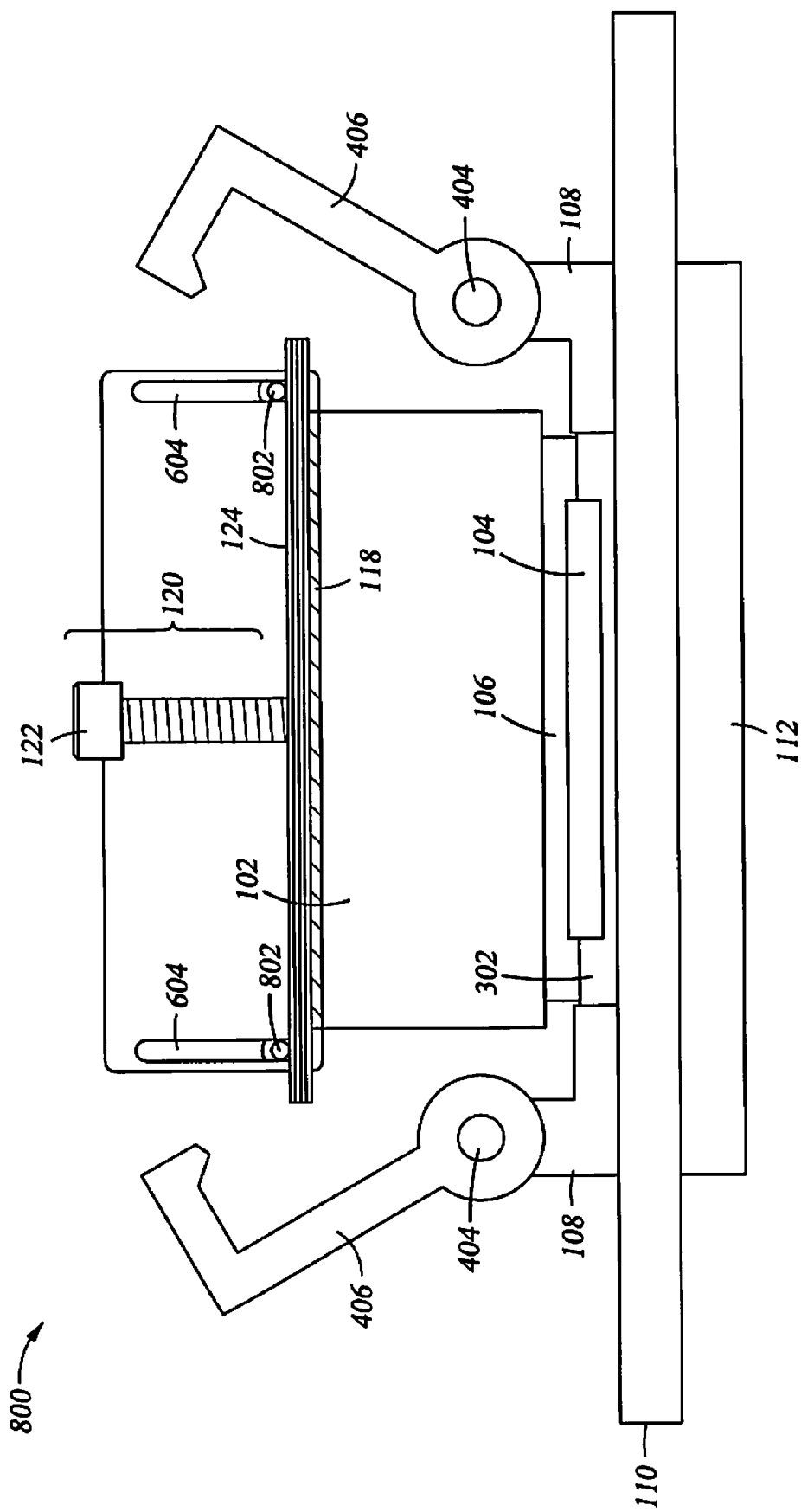
FIG. 8 is a block diagram illustrating the PCB after the addition of spring plate retention pins, according to one embodiment of the invention.
Figure 9:
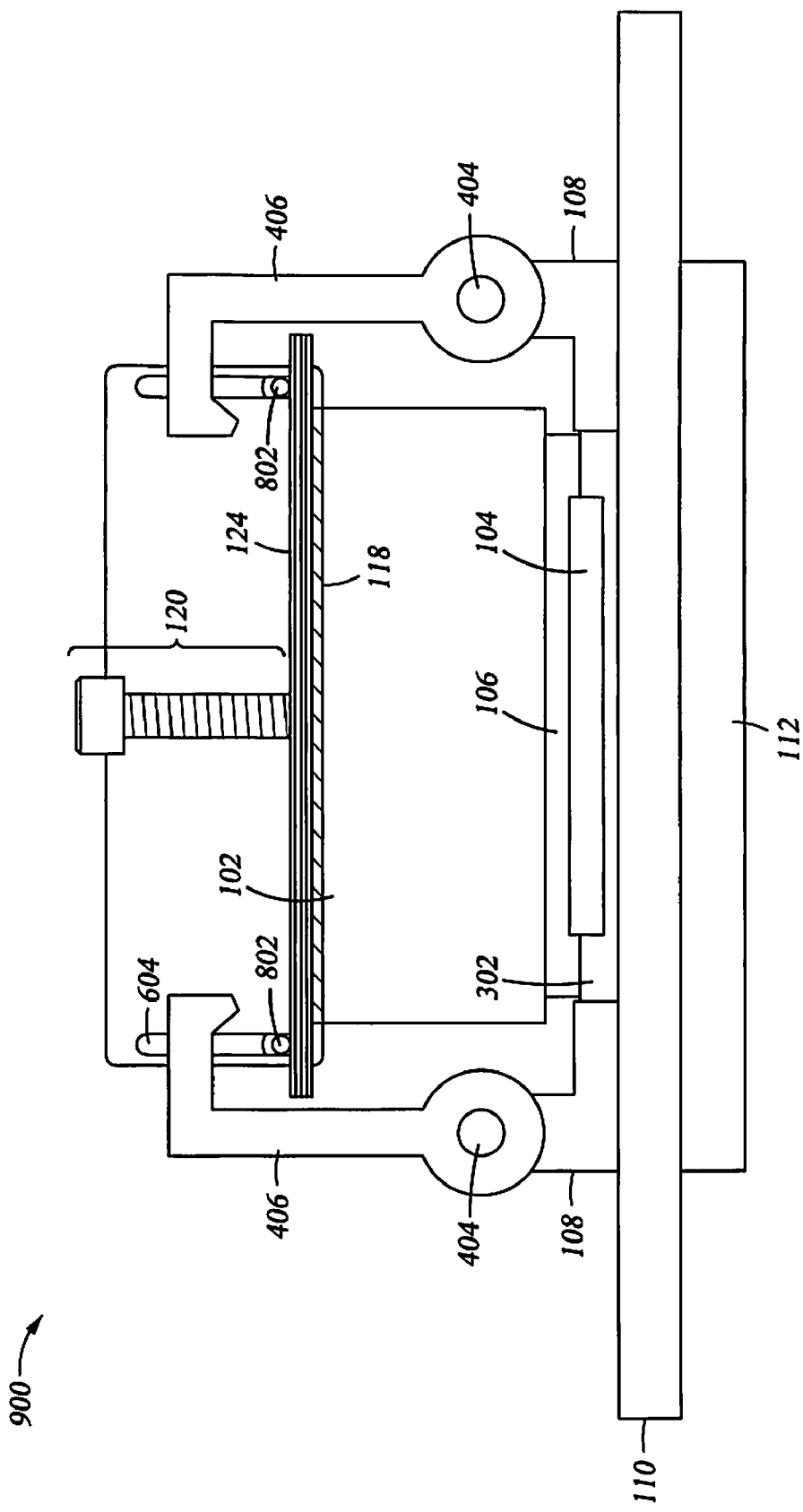
FIG. 9 is a block diagram illustrating the PCB after the load arms have been swung into place, according to one embodiment of the invention.

In one embodiment, as described in step 212 of the process 200, spring plate retention pins 802 may be added to the assembly. As depicted in FIGS. 8, 12, and 13, the spring plate retention pins 802 may be inserted into the spring plate retention pin guide slots 604 over the spring plate 124. Then, the load arms 406 may be pivoted into place over the spring plate retention pins 802, as described in step 214 and depicted in FIG. 9 and FIG. 13.

Figure 10:
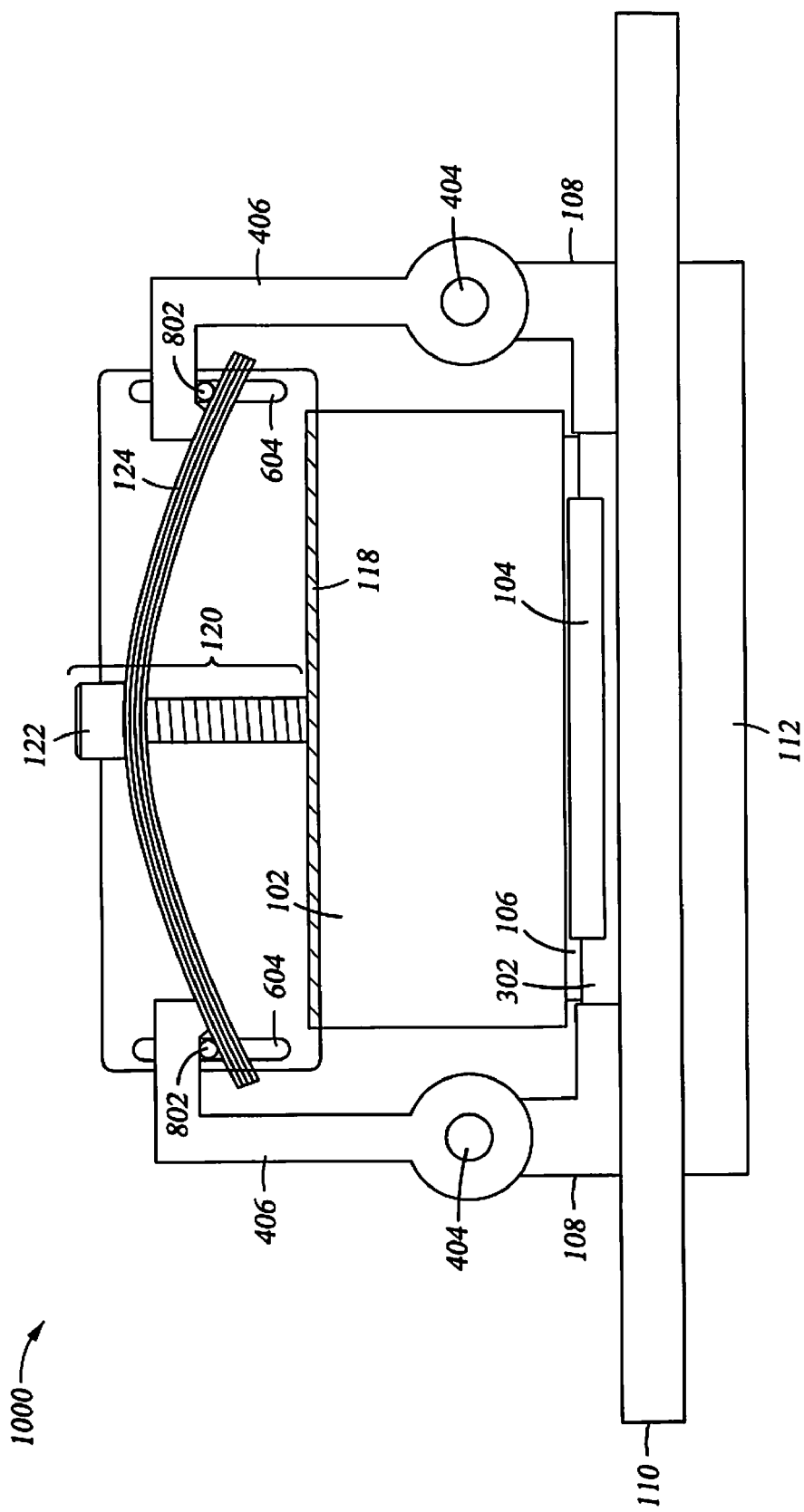
FIG. 10 is a block diagram illustrating the PCB after the actuation screw has been tightened, according to one embodiment of the invention.
Figure 11:
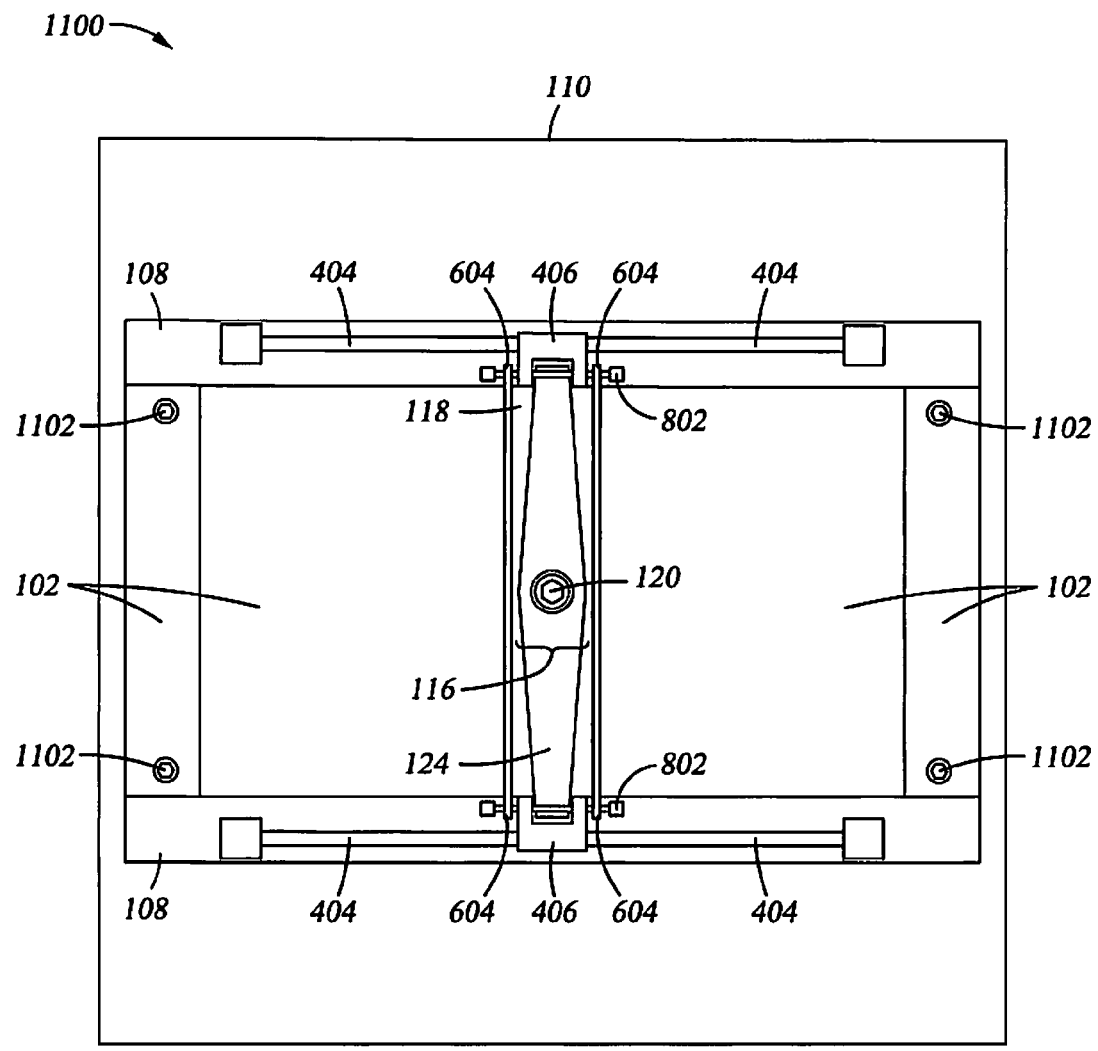
FIG. 11 is a block diagram illustrating a top view of the PCB and heatsink assembly, including non-influencing fasteners, according to one embodiment of the invention.

In one embodiment, as described in step 216 of the process 200, the actuation screw 120 may be threaded into the spring plate 124 until the mechanical constraint (e.g., screw head 122) of the actuation screw 120 is snug against the spring plate 124. As described above, threading the actuation screw 120 may raise the spring plate 124 until its sides press against the spring plate retention pins 802. As the actuation screw 120 continues to be threaded, the sides of the spring plate 124 may be obstructed by the spring plate retention pins 802 restricted by the hooks in the load arms 406. As the actuation screw 120 is threaded further, the spring plate 124 may deflect, generating a tension in the load arms 406 and a downward force on the heatsink, as is depicted in FIG. 10. Furthermore, the spring rods 404 may deflect upwards in their center as a result of the tension in the load arms 406.

In one embodiment, the thermally conductive material 106 may need to be cured, as in step 218. After curing, non-influencing fasteners 1102 may be engaged, as described in step 220 of the process 200, so that the heatsink 102 is tightly held onto the front-side stiffener 108 without affecting the force exerted on the IC package 104 by the heatsink 102. A possible location of the non-influencing fasteners 1102 may be seen in FIGS. 11, 12, and 13. Alternatively, the thermally conductive material 106 may not be cured.

In one embodiment, the process 200 can be utilized to install a heatsink 102 for applying a calibrated pressure to the IC device 104, as described above. Calibration may be possible because the pressure exerted on the IC device 104 may be a function of the deflection in the spring rods 404 and spring plate 124 as well as the length of the actuation screw 120. If the actuation screw 120 is longer, and/or the spring rods 404 and/or spring plate 124 are stiffer, the pressure exerted on the IC device 104 by the heatsink 102 may be greater.

In one embodiment, a combined deflection of the spring rods 404 and the spring plate 124 may produce the compressive force applied to the heatsink 102 and to the IC device 104. Thus the pressure exerted on the IC device 104 may be due to deflection of both the spring rods 404 and the spring plate 124. Optionally, in one embodiment, the spring rods 404 may not deflect, and all of the applied compressive force may be generated by the deflection of the spring plate 124 (e.g., the collective deflection may be equal to the deflection of the spring plate 124). Similarly, in one embodiment, the spring plate 124 may not deflect, and all of the applied compressive force may be generated by the deflection of the spring rods 404 (e.g., the collective deflection may be equal to the deflection of the spring rods 404).

One skilled in the art will recognize that there are many variations possible to the present invention that do not change the scope of the invention. For example, the spring plate retention pin guide slots 604 may be omitted and/or the spring plate retention pins 802 may be affixed to the spring plate 124.

While the foregoing is directed to embodiments of the present invention, other and further embodiments of the invention may be devised without departing from the basic scope thereof, and the scope thereof is determined by the claims that follow.

What is claimed is:

1. A device for applying a specific compressive force from a heat dissipation device onto one or more integrated circuit devices, comprising:
   an integrated circuit disposed on a PCB;
   the heat dissipation device disposed on the integrated circuit;
   a spring plate disposed on the heat dissipation device;
   an actuation screw through the spring plate configured to cause a compressive force to be applied from the heat dissipation device onto the one or more integrated circuit devices when the actuation screw is tightened, wherein the actuation screw is prevented from being tightened beyond a mechanical constraint corresponding to a pre-set calibration for the specific compressive force,
   a front-side stiffener mounted to the PCB; and
   one or more non-influencing fasteners, wherein the heat dissipation device is secured to the front-side stiffener without affecting the specific compressive force on the integrated circuit device by engaging the one or more non-influencing fasteners.

2. The device of claim 1, wherein the actuation screw is tightened until the mechanical constraint is reached, thereby causing the specific compressive force to be applied on the integrated circuit from the heat dissipation device.

3. The device of claim 1, wherein the mechanical constraint comprises one of a screw head, a washer, a spacer, a nut, a non-threaded portion of the actuation screw, a pin through the actuation screw, and a discontinuity in the thread pattern of the actuation screw.

4. The device of claim 1, wherein the pre-set calibration for the specific compressive force corresponds to the total deflection distance.

5. The device of claim 1, wherein the actuation screw is threaded through the spring plate.

6. The device of claim 1, further comprising:
   one or more spring rods connected to the front-side stiffener; and
   one or more load arms connected to and able to pivot around the one or more spring rods, wherein the one or more load arms are positioned over the spring plate retention pins prior to the actuation screw being tightened.

7. A device for applying a specific compressive force from a heat dissipation device onto one or more integrated circuit devices, comprising:
   an integrated circuit disposed on a PCB;
   the heat dissipation device disposed on the integrated circuit:
   a spring plate disposed on the heat dissipation device; and
   at least two load arms pivotably mounted on the respective spring rods, wherein the load arms are pivotable into a retaining position in which a respective contact portion of the arms is disposed over the spring plate;
   at least two retention pins slidably disposed in respective slots, each retention pin located between the spring plate and a respective one of the at least two load arms; and
   an actuation screw through the spring plate configured to cause a compressive force to be applied from the heat dissipation device onto the one or more integrated circuit devices when the actuation screw is tightened, wherein the actuation screw is prevented from being tightened beyond a mechanical constraint corresponding to a pre-set calibration for the specific compressive force; wherein, as the actuation screw is tightened, the spring plate is urged away from the integrated circuit, thereby causing the retention pins to travel through the respective slots and bringing the retention pins into contact with the respective contact portion of the arms.

8. The device of claim 7, wherein at least one of the spring plate and a spring rod deflects as the actuation screw is tightened, and a combined deflection of the spring rod and the spring plate results in a total deflection distance.

9. A device for applying a specific compressive force from a heat dissipation device onto one or more integrated circuit devices, comprising:
   an integrated circuit disposed on a PCB;
   the heat dissipation device disposed on the integrated circuit;
   a spring plate disposed within a channel in the heat dissipation device; and
   an actuation screw through the spring plate configured to cause a compressive force to be applied from the heat dissipation device onto the one or more integrated circuit devices when the actuation screw is tightened, wherein the actuation screw is prevented from being tightened beyond a mechanical constraint corresponding to a pre-set calibration for the specific compressive force; wherein sides of the spring plate are bounded vertically by spring plate retention pins, and the sides of the spring plate are raised as the actuation screw is tightened until they are vertically limited by the spring plate retention pins, wherein further tightening causes the spring plate to deflect, thereby generating the specific compressive force on the integrated circuit device.

* * * * *